(12) United States Patent
Reese

(10) Patent No.: US 9,559,684 B1
(45) Date of Patent: Jan. 31, 2017

(54) NON LINEAR RESONANT SWITCH CELL

(71) Applicant: Arkansas Power Electronics International, Inc., Fayetteville, AR (US)

(72) Inventor: Bradley Alan Reese, Fayetteville, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 0 days.

(21) Appl. No.: 14/309,155

(22) Filed: Jun. 19, 2014

Related U.S. Application Data

(60) Provisional application No. 61/836,887, filed on Jun. 19, 2013.

(51) Int. Cl.
*H03K 17/56* (2006.01)
*H03K 17/687* (2006.01)
*H03K 17/0814* (2006.01)

(52) U.S. Cl.
CPC ....... *H03K 17/687* (2013.01); *H03K 17/08142* (2013.01); *H03K 17/6871* (2013.01); *H03K 2217/0054* (2013.01)

(58) Field of Classification Search
None
See application file for complete search history.

(56) References Cited

U.S. PATENT DOCUMENTS

| 5,559,463 A * | 9/1996 | Denker | H03K 3/354 327/177 |
| 5,875,103 A * | 2/1999 | Bhagwat | H02M 3/3376 363/17 |
| 6,111,458 A * | 8/2000 | Ideler | G01R 33/3852 327/108 |
| 6,344,768 B1 * | 2/2002 | Daun-Lindberg | H02M 3/337 327/108 |
| 2004/0239401 A1 * | 12/2004 | Liao | H02M 1/38 327/423 |
| 2006/0028261 A1 * | 2/2006 | Hsieh | H02M 7/53871 327/423 |
| 2009/0219075 A1 * | 9/2009 | Steuber | H02M 7/53871 327/423 |
| 2013/0187700 A1 * | 7/2013 | Huang | H02M 3/158 327/365 |

(Continued)

OTHER PUBLICATIONS

Cho, J.G.; Cho, G.H.; "Cyclic quasi-resonant converters: a new group of resonant converters suitable for high performance DC/DC and AC/AC conversion applications," Proceedings of the IECON '90, pp. 956-963 vol. 2, Nov. 27-30, 1990.

(Continued)

*Primary Examiner* — Tuan T Lam
(74) *Attorney, Agent, or Firm* — Baker & Hostetler LLP

(57) ABSTRACT

Switch cells consist of an array of power switches and passive components which can replace the main switches in many power topologies, allowing reduced switching loss without altering the power topology directly. The switch cell topology discussed herein utilizes a saturable resonant inductor to reduce the size and power loss of the cell. Additionally, the cell transfers energy stored in the inductor into a capacitor for efficient energy storage during the cell's conduction region. This energy is then transferred back to the system when the cell turns off, thus reducing the total switching energy.

18 Claims, 8 Drawing Sheets

(56) References Cited

U.S. PATENT DOCUMENTS

2014/0355319 A1* 12/2014 Cohen .................. H02M 7/217
363/126

OTHER PUBLICATIONS

S. Ben-Yaakov and G. Ivensky, "Passive lossless snubbers for high frequency PWM converters," IEEE Applied Power Electronics conference, APEC-99, Dallas, 1999.

M.L. Martins, J.L. Russi, and H.L. Hey, "Novel synthesis methodology for resonant transition PWM converters," $8^{th}$ Brazilian Power Electronics Conference, COBEP 2005.

Yu-Ming Chang; Jia-You Lee; Wen-Inne Tsai; York-Yih Sun; "An H-soft-switched cell for single-switch nonisolated DC-to-DC converters," Proceedings of the IECON '93, pp. 1077-1082 vol. 2, Nov. 15-19, 1993.

* cited by examiner

NON LINEAR RESONANT SWITCH CELL

CROSS-REFERENCE TO RELATED APPLICATIONS

This application claims priority to and is a continuation-in-part of U.S. Provisional Patent Application Ser. No. 61/836,887, filed on Jun. 19, 2013 entitled NONLINEAR RESONANT SWITCH CELL which is hereby incorporated by reference in its entirety.

STATEMENT REGARDING FEDERALLY SPONSORED RESEARCH OR DEVELOPMENT

This invention was made with government support under want NNX11CA66C awarded by the National Aeronautics and Space Administration. The United States government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in switch cells. More particularly, the invention relates to improvements particularly suited for providing debris protection of the vehicle mirror while also displaying decorative elements such as athletic team emblems or colors on vehicle side view mirrors. In particular, the present invention relates specifically to a flexible body suitable for installation over a vehicle mirror.

2. Description of the Known Art

As will be appreciated by those skilled in the art, switch cells are known in various forms. Soft-switched cells are an attractive means of reducing switching loss in power converters since the energy recovery method only needs to be developed once and the cell can then be reused on many types of power topologies. Some cell topologies can even absorb energy from the power topology's circuit elements such as the winding capacitance of a power transformer. In these cases, the cell may require slight tuning for each topology to achieve optimal energy recovery. Quasi-resonant switch cells offer simple circuit topologies and control; however, they exhibit high nonlinearity, their characteristics vary widely with changing loads, and they cannot be used with pulse width modulation (PWM). Snubbers can also decrease switching loss by reducing the amount of overlap between the power switch voltage and current. Snubbers are less efficient than quasi resonant cells because they only achieve pseudo soft switching i.e., overlapping is not completely eliminated. Many cell topologies, allow inductive energy to circulate within the cell which dissipates the stored energy in the semiconductor devices over time. The topology presented herein aims to mitigate some of these issues.

Articles disclosing information relevant to switch cells include: REFERENCES:

[1] Cho, J. G.; Cho, G. H.; "Cyclic quasi-resonant converters: a new group of resonant converters suitable for high performance DC/DC and AC/AC conversion applications," Proceedings of the IECON '90, pp. 956-963 vol. 2, 27-30 Nov. 1990.

[2] S. Ben-Yaakov and G. Ivensky, "Passive lossless snubbers for high frequency PWM converters," IEEE Applied Power Electronics conference, APEC-99, Dallas, 1999.

[3] M. L. Martins, J. L. Russi, and H. L. Hey, "Novel synthesis methodology for resonant transition PWM converters," 8th Brazilian Power Electronics Conference, COBEP 2005.

[4] Yu-Ming Chang; Jia-You Lee; Wen-Inne Tsai; York-Yih Sun; "An H-soft-switched cell for single-switch nonisolated DC-to-DC converters," Proceedings of the IECON '93, pp. 1077-1082 vol. 2, 15-19 Nov. 1993.

Each of these articles is hereby expressly incorporated by reference in their entirety.

From these prior references it may be seen that these prior art patents are very limited in their teaching and utilization, and an improved switch cell is needed to overcome these limitations.

SUMMARY OF THE INVENTION

Switch cells consist of an array of power switches and passive components which can replace the main switches in many power topologies, allowing reduced switching loss without altering the power topology directly. The present invention is directed to an improved switch cell using a saturable resonant inductor to reduce the size and power loss of the cell. Additionally, the cell transfers energy stored in the inductor into a capacitor for efficient energy storage during the cell's conduction region. This energy is then transferred back to the system when the cell turns off, thus reducing the total switching energy. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
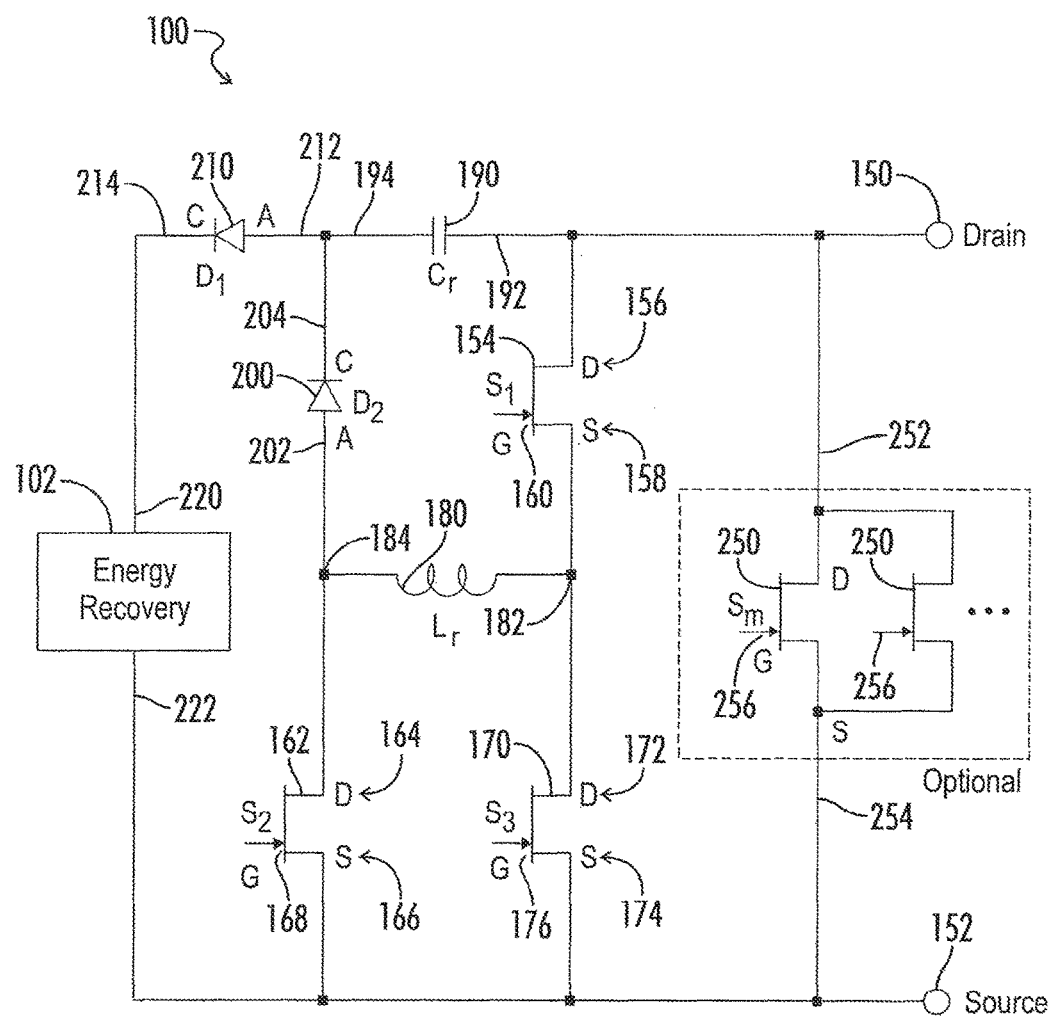
FIG. 1 shows the schematic diagram of the nonlinear switch cell.

As shown in FIG. 1 of the drawings, one exemplary embodiment of the present invention is generally shown as a nonlinear switch cell 100. The cell 100 can replace main switch positions in many topologies of switching power converters. The energy recovery sink 102 portion of this diagram represents an energy sink within the power system. The cell 100 redirects a portion of the switching energy into this sink 102 during both turn-on and turn-off. This could include the input power bus, the converter's output, or an auxiliary power supply for the power system's controller and/or gate drivers.

The nonlinear resonant switch cell 100 includes a switch cell drain connection 150, a switch cell source connection 152, with a first junction gate field-effect transistor 154 with a first jfet drain 156, a first jfet source 158, and a first jfet gate 160, the first jfet drain 156 is electrically connected to the switch cell drain connection 150. Also included is a second junction gate field-effect transistor 162 with a second jfet drain 164, a second jfet source 166, and a second jfet gate 168, the second jfet source 166 is electrically connected to the switch cell source connection 152. Further shown is a third junction gate field-effect transistor 170 with a third jfet drain 172, a third jfet source 174, and a third jfet gate 176 with the third jfet drain 172 electrically connected to the first jfet source 158, and the third jfet source 174 electrically connected to the switch cell source connection 152. The resonant inductor 180 is shown with a first inductor terminal 182 and a second inductor terminal 184 and the first inductor terminal 182 is electrically connected to the first jfet source 158. The second inductor terminal 184 is electrically connected to the second jfet drain 164. Next is the recovery capacitor 190 with a first capacitor terminal 192 and a second capacitor terminal 194. The first capacitor terminal 192 is electrically connected to the switch cell drain connection 150. A drain clamp diode 200 is shown with a clamp anode 202 and a clamp cathode 204. The clamp anode 202 is electrically connected to the second inductor terminal 184 and the clamp cathode 204 is electrically connected to the second capacitor terminal 194. Still further, an energy transfer diode 210 is shown with a transfer anode 212 and a transfer cathode 214. The transfer anode 212 is electrically connected to the second capacitor terminal 194. Finally, an energy recovery component 102 is shown with a first terminal 220 and a second terminal 222 and the first terminal 220 is electrically connected to the transfer cathode 214 and the second terminal 222 electrically connected to the switch cell source connection 152.

Optionally, one or more parallel connected main junction gate field-effect transistor 250 can be added with each main junction gate field-effect transistor including a main drain 252, a first main source 254, and a main gate 256. Each main drain 252 is electrically connected to the switch cell drain connection 150, and each main source 254 is electrically connected to the switch cell source connection 152.

The key feature of this switch cell topology is the use of a nonlinear or saturable resonant inductor, Lr. In its linear region, Lr will have very high inductance which can virtually eliminate current rise in power switches during turn-on. When Lr saturates, its inductance becomes very low, causing the current through it to increase rapidly. If the saturation time is timed well with the transition time of the power switch, the switch will transition under a very effective pseudo zero current switching event. This allows significant reduction in the inductor's volume, weight, and power loss. Another benefit is that the saturable inductor will fully transition much faster than a linear inductor, allowing higher switching frequencies. The main requirement for using a saturable inductor in a switch cell is insurance of flux resetting. When the inductor saturates in one direction, its flux density will remain near saturation, also known as the remnance point, even under zero magnetization. Thus, at the next switching event the inductor will not be able to pass through its linear region because it is already virtually saturated. Most of the switch cell topologies surveyed could not reverse the flux in the inductor, and none were able to accomplish flux reversal efficiently. Portions of the topology presented here are designed specifically for efficient flux reversal of Lr.

The main power switches Sm shown as parallel main switch 250 is optional if lower on-resistance is desired. Removal of Sm may be desirable to reduce complexity of the cell's gate driver circuitry. If Sm is removed, all of the drain current flows through S1 and S3 in the ON state. It is desirable to have S1 and S3 be fast devices to reduce the size of Lr. However, this has the effect of increasing on-resistance and, thus, power dissipation of these components during conduction. Sm can be a much larger device with low on-resistance. Its larger drain-source capacitance will present more stored energy; however, some of that energy can be absorbed by the cell and redirected to the energy recovery circuit. Since this redirection is imperfect, switching losses will continue to increase with increasing size of Sm and the optimal sizing of Sm will eventually reach a maximum.

Figure 2:
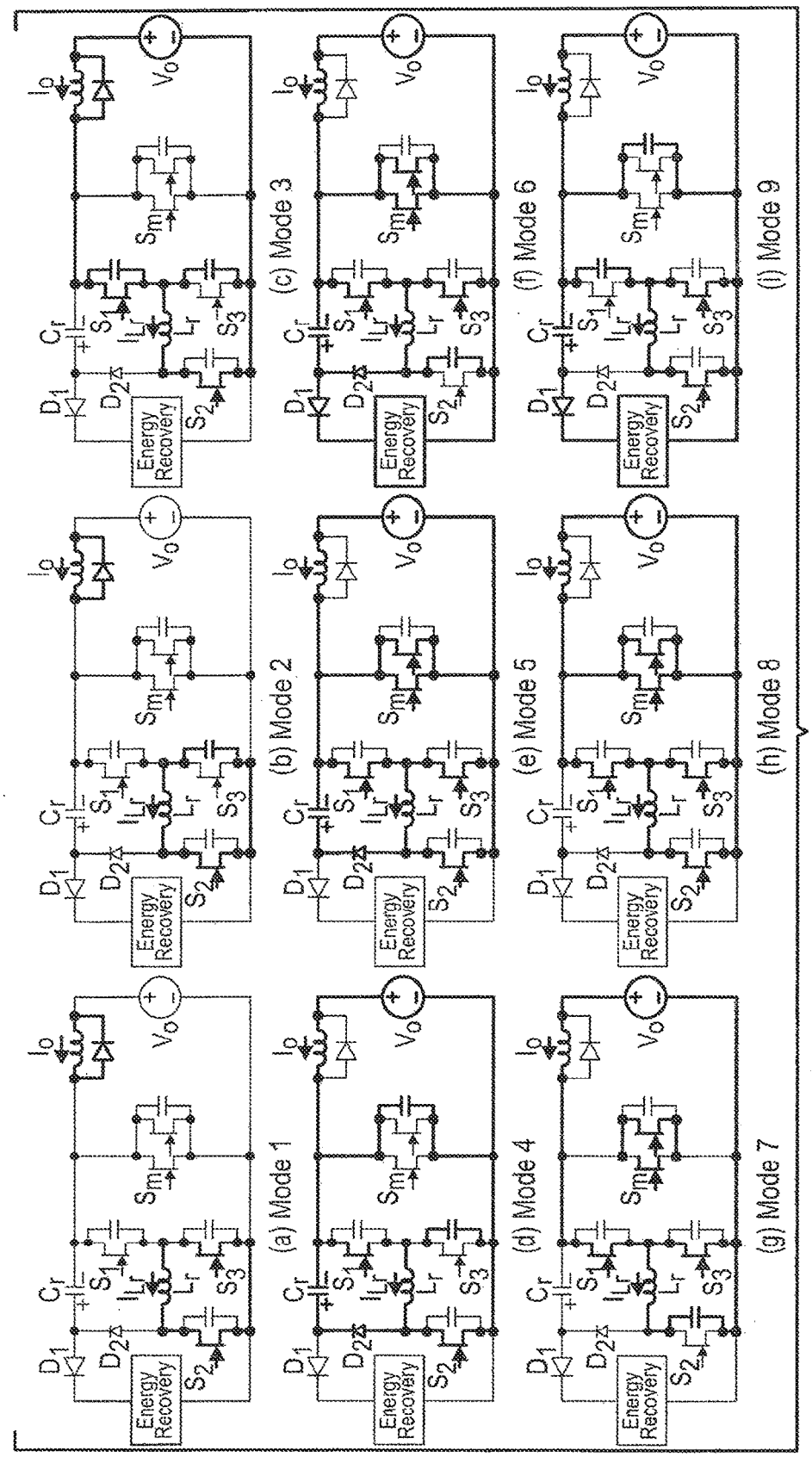
FIG. 2 shows operational modes of the nonlinear switch cell.
Figure 3:
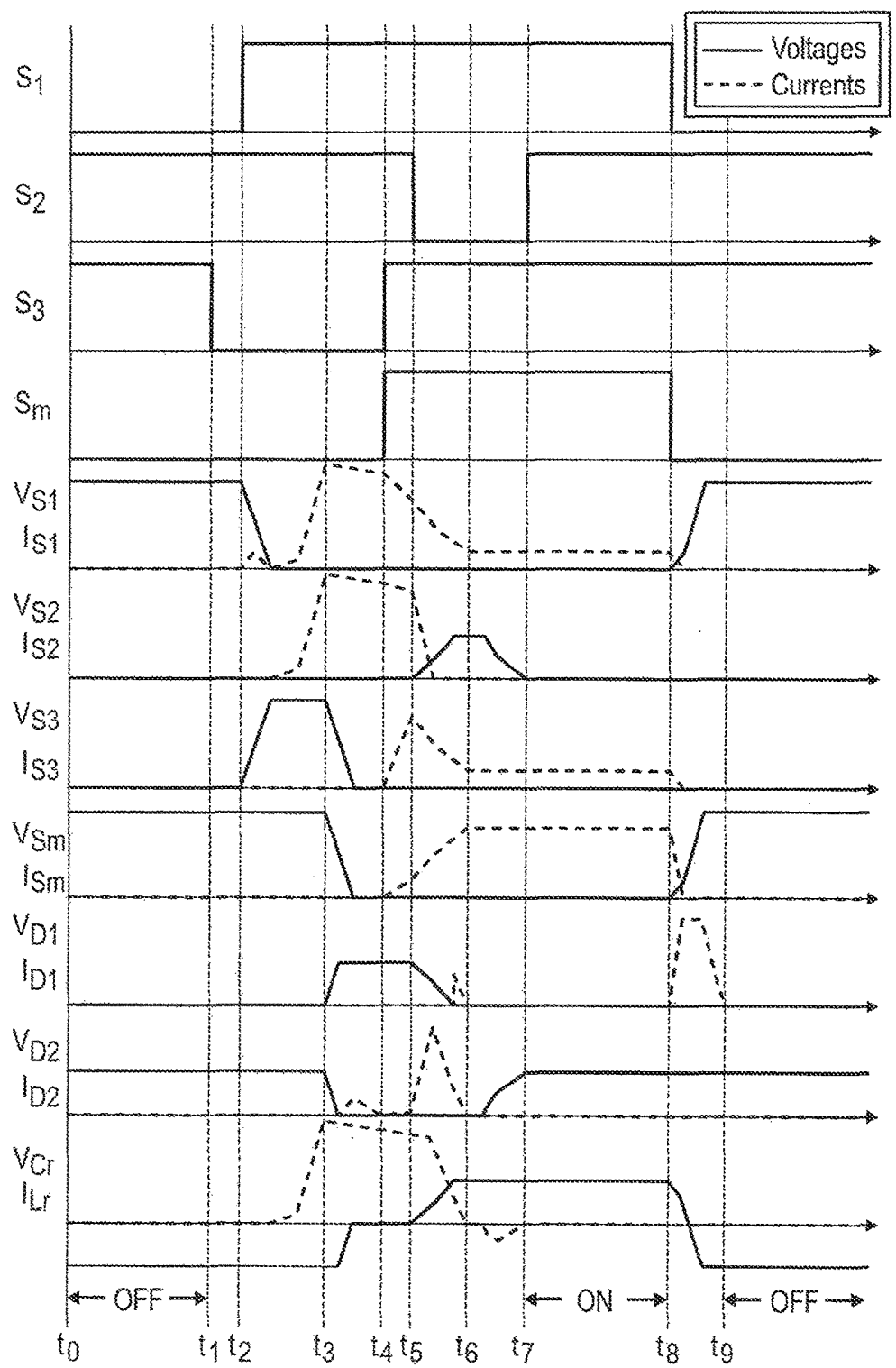
FIG. 3 shows the key waveforms for the nonlinear switch cell.

The nine operational modes of the switch cell are displayed in FIG. 2 and the corresponding key waveforms are shown in FIG. 3. The mode diagrams are analyzed in a clamped inductive circuit, which is a standard means of measuring switching loss in power devices. The clamped inductance is assumed to be large enough that the load current, Io, does not change significantly in the switching period. Power switch capacitances are shown in the mode diagrams to clarify transient current paths. The waveforms assume that the energy recovery voltage is half of the bus voltage, Vo. The modes are explained as follows:

Mode 1. (t0, t1): This mode is the switch cell's OFF state. S1 and Sm are off and the load current is flowing through the freewheeling diode of the clamped inductive test setup. S2 and S3 are on to prevent any ringing at the drain from affecting Lr.

Mode 2. (t1, t2) This mode initiates the switch cell's turn-on process. S3 is turned off to insert dead time between the transition of S3 and S1 in the next mode.

Mode 3. (t2, t3): S1 turns on with pseudo zero current switching since Lr is at 0 A and cannot change instantaneously. With sufficiently large inductance of Lr, the contribution of switching loss due to load current is insignificant. Energy required to transition the capacitances of S1 and S3 are the main source of loss in this mode. When S1 fully turns on, Vo is applied across Lr. This increases its flux density until it reaches saturation at t2+tsat. After saturation, Lr reduces to a very small inductance, allowing a rapid increase in current through S1, Lr, and S2. The time t3–t2 is defined by the time required to saturate Lr and increase its current to Io.

Mode 4. (t3, t4): When ILr reaches Io the freewheeling diode becomes reversed biased and the drain voltage begins to fall. Energy stored in the capacitances of Sm and S2 are transferred into Lr. When the drain voltage equals −VCr, clamp diode D2 conducts and clamps the +side of Cr to ground. D2 has an anode A and a cathode C as understood in the art and as shown in the schematic of FIG. 1. Energy stored in Cr is transferred into Lr. The transferred capacitive energy manifests as increased current over Io in Lr. The time t4–t3 is defined by the time required to reach steady state on the drain voltage.

Mode 5. (t4, t5): The drain voltage fully transitions low. Sm and S3 are turned on with true zero voltage switching. Sm will most likely be physically located far away from the rest of the cell since it is a larger device. The resulting parasitic inductance will cause the current to rise slowly in Sm and may span several modes. Thus, S3 "catches" S1 in this mode, preventing the drain from transitioning high in the next mode where the main current path would otherwise be redirected away from ground. The time t5–t4 is defined by the time required to fully turn on S3.

Mode 6. (t5, t6): S2 turns off under pseudo zero voltage switching. ILr charges the capacitance of S2 and Cr through D2. ILr decreases as the energy stored in Lr is transferred into Cr and S2. If the energy in Lr is enough to make VCr increase to the energy recovery voltage, D1 will forward bias and any remaining energy will be delivered to the energy recovery circuitry. D1 has an anode A and a cathode C as understood in the art of diodes as shown in FIG. 1. The time t6–t5 is defined by the time required to fully deplete ILr to zero.

Mode 7. (t6, t7): This mode completes the switch cell's turn-on process. The voltage on S2 is retained by S2's capacitance. This voltage is applied across Lr, which reverses its magnetization until it saturates in the opposite direction. This causes the voltage on S2 to fall to ground. The energy transferred from S2's capacitance is dissipated as conduction loss in Lr, S2 and S3 in the next mode. The time t7–t6 is defined by the time required to fully transition the voltage on S2 to zero.

Mode 8. (t7, t8): This mode is the switch cell's ON state. S2 is turned on with true zero voltage switching. S2 prevents a possible oscillation with Lr and S2's capacitance, and preserves the polarity of flux density in Lr. The latter is especially important since a flux reversal at this point would cause Lr to instantly saturate at the next turn-on, thus eliminating the pseudo zero current switching of S1.

Mode 9. (t8, t9): This mode is the switch cell's turn-off state. S1 and Sm are turned off with pseudo zero voltage switching. If D1 is already forward biased, the drain current instantly transfers to Cr, delivering current to the energy recovery circuitry and discharging Cr. S3 must remain on during this transient to prevent the capacitance of S1 from pulling up the voltage across Lr, which could cause flux reversal. The time t9–t8 is defined by the time required to fully transition the drain voltage to Vo.

Switch Cell Fabrication

Figure 4:
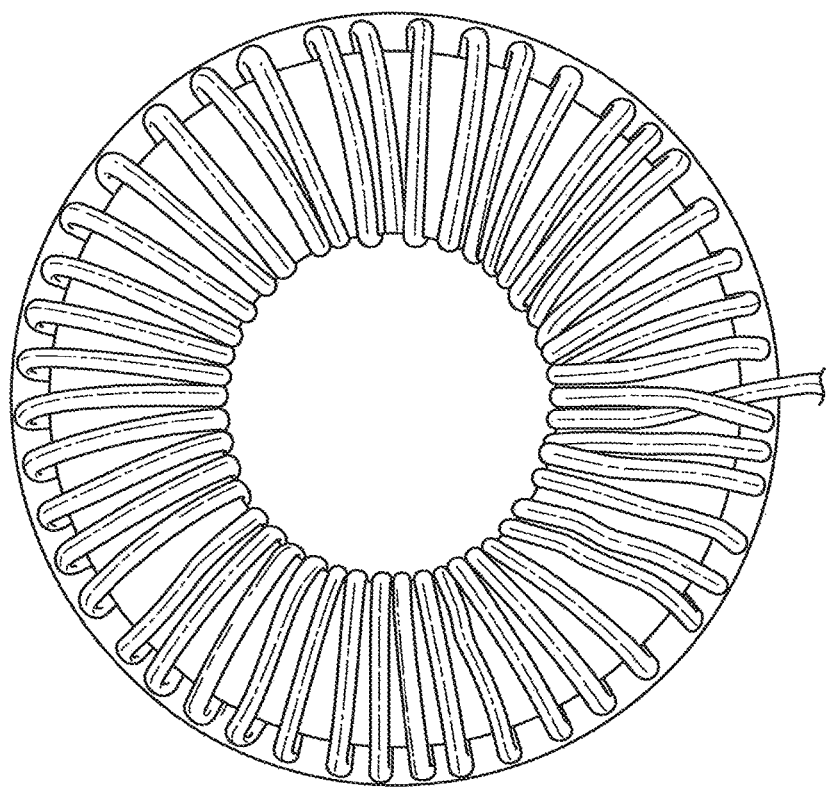
FIG. 4 shows a size comparison of a 20 A pulsed, 40 uH saturable inductor (left) and a 20 A continuous, 40 uH linear inductor (right).
Figure 4:
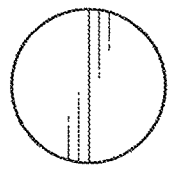
Figure 4:
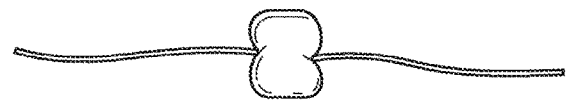

FIG. 4 shows the saturable resonant inductor (left) along next to a U.S. dime coin with an equivalent linear inductor (right). The current through the saturable inductor is pulsed; therefore, its wire diameter can be greatly reduced. Most of the switch cell topologies implementing linear inductors allow the main current to pass through them continuously, thus requiring a larger wire size. The saturable inductor has 10× lower power loss and 77× smaller volume than the linear inductor. Since the reduction in volume is greater than the reduction in power loss, the temperature rise of the saturable inductor is higher. Depending on operating conditions, the saturable inductor may require attachment to the power system's heatsink.

Figure 5:
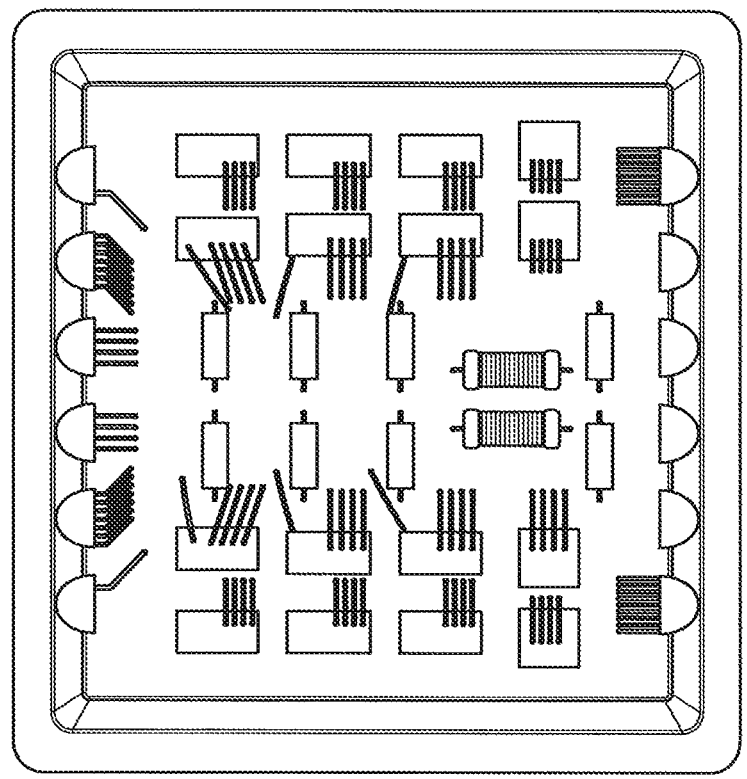
FIG. 5 shows an actual circuit with auxiliary switches, S1-S3 (left) and main switch, Sm (right).
Figure 5:
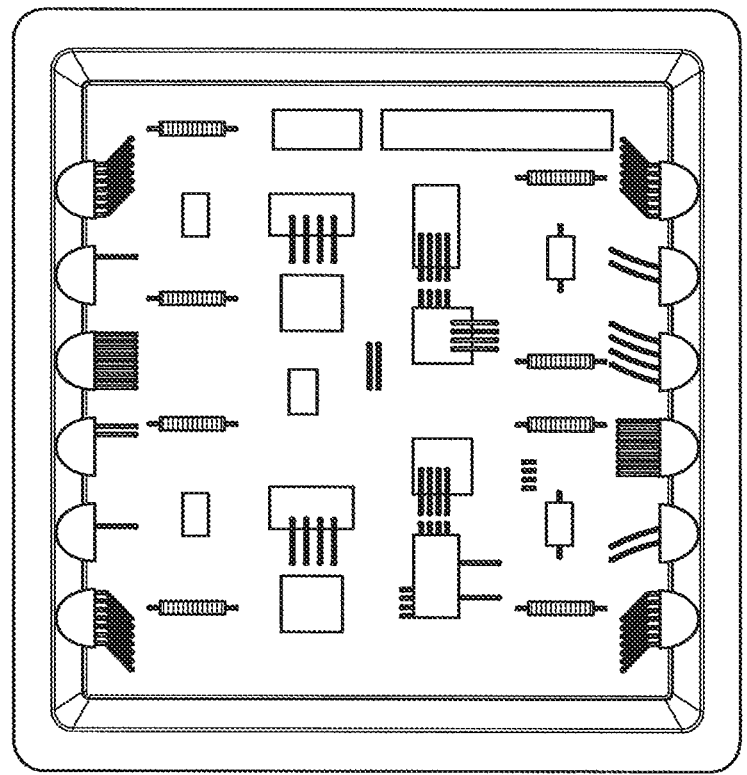

FIG. 5 shows the packaged auxiliary switches, S1-S3 (left) and the main switch, Sm (right), which consists of twelve power devices of the same size as the auxiliary devices. The switches are packaged on direct bond copper (DBC) substrates in a metal package and passivated with a high voltage gel. Each device is a SemiSouth 1200 V 50 mΩ SiC junction gate field-effect transistor JFET with a source (S) a drain (D) and a gate (G) commonly understood in the art and as labeled in FIG. 1. These devices require local gate-source capacitors to reduce ringing and chance of parasitic turn-on during transients on their drains. Zener diodes are also included in the package to prevent voltage spikes on the gates. Cr is also included in the package to reduce parasitic inductance between Cr and the auxiliary switches.

Figure 6:
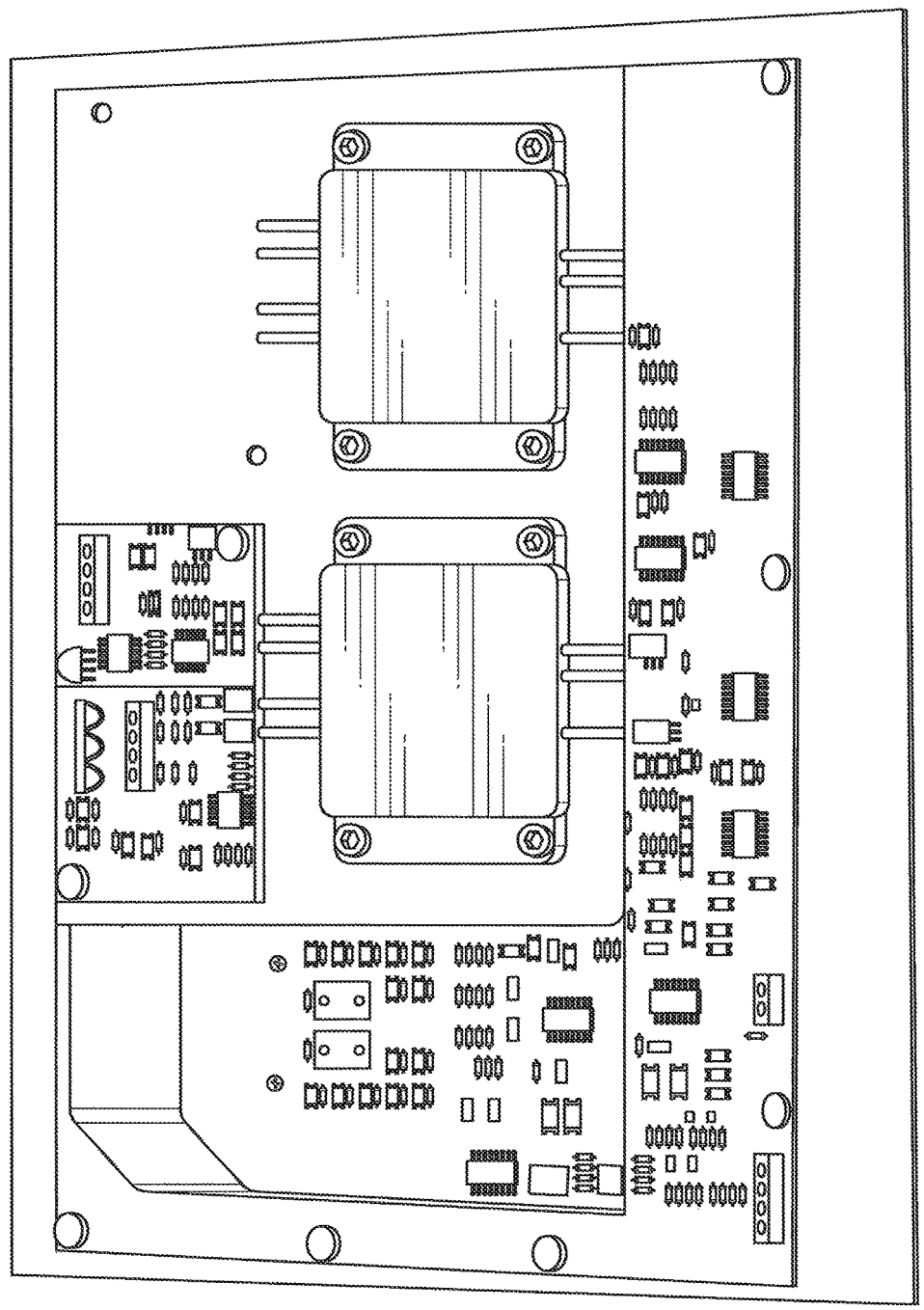
FIG. 6 shows auxiliary and main switches mounted with the switch cell's gate driver PCB.

FIG. 6 shows the auxiliary and main switches mounted with the cell's gate driver PCB. The gate driver requires only the PWM signal generated by the power system's controller. On-board circuitry generates all of the timing and sequencing required to operate the switch cell properly. The gate driver includes two volt-second detectors to determine the optimal timing of modes 3 and 7. One monitors the bus voltage to determine the saturation time of Lr during turn-on. The other monitors the energy recovery voltage to determine saturation time during flux reset. The gate driver includes additional, fixed timing circuitry to provide deadtime between S1 and S3 in mode 2 and overlapping of S2 and S3 in mode 5. The output stages of the gate driver increase the voltage and current levels needed to drive the power devices. All output stages are referenced to ground, except the output for S1 which must be isolated or level shifted.

Switch Cell Testing

Figure 7:
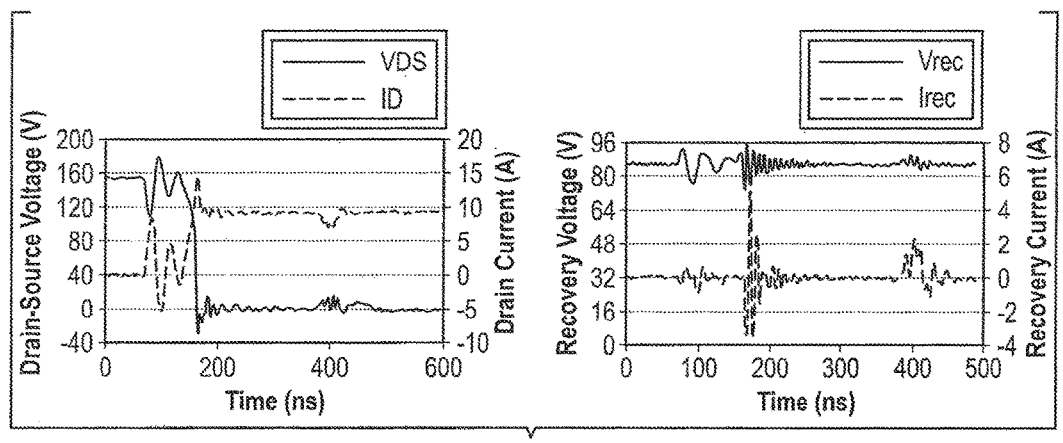
FIG. 7 shows the power waveforms for the switch cell during turn-on (top) and turn-off (bottom).
Figure 8:
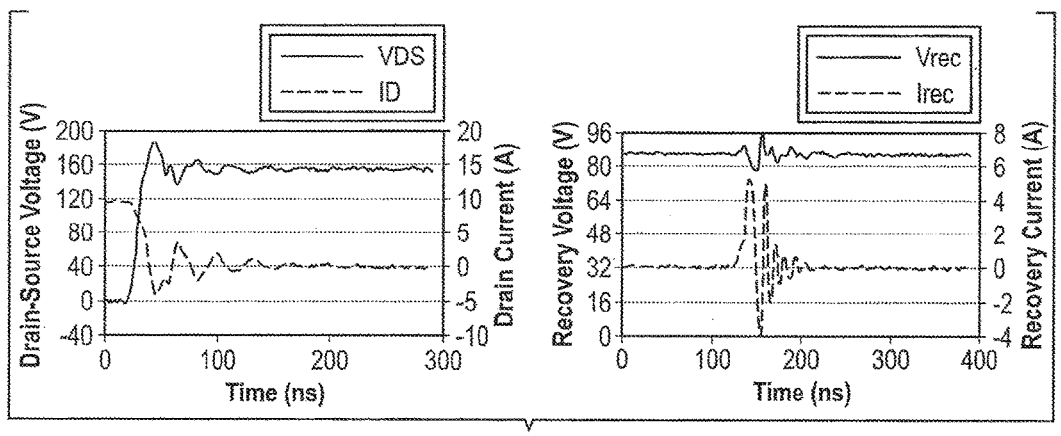
FIG. 8 shows the power waveforms for the recovery circuitry.

The power waveforms for the switch cell are shown in FIG. 7 during turn-on (top) and turn-off (bottom). FIG. 8 shows the power waveforms for the recovery circuitry. The turn-on sequence initiates at ~100 ns. The inductor then saturates at ~150 ns, causing the drain voltage to fall and current to rise. At ~400 ns the inductor current is transferred into Cr and the recovery circuitry. At turn-off the main current redirects from the switch cell into the recovery circuitry.

Figure 9:
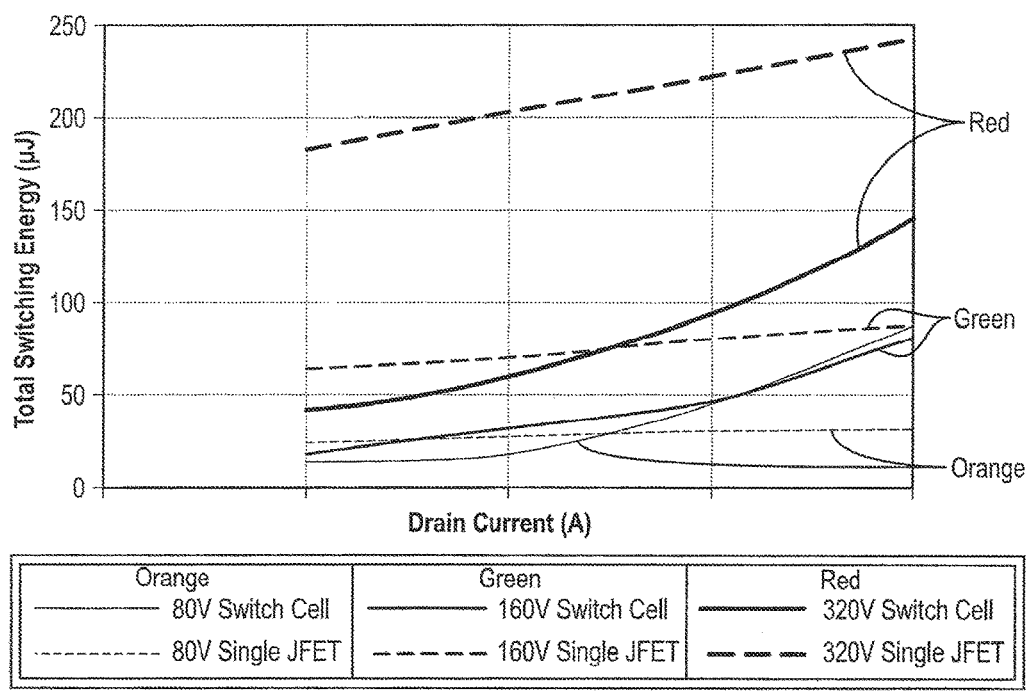
FIG. 9 shows a comparison of switching energy vs. drain current between a single JFET (dashed) and the switch cell (solid) at 80 V (orange), 160 V (green), and 320 V (red).

FIG. 9 shows a comparison of switching energy vs. drain current between a single JFET (dashed) and the switch cell (solid) at 80 V (orange), 160 V (green), and 320 V (red). At 80 V the switch cell has minimal improvement and is actually less efficient at higher current levels. At 160 V the switch cell outperforms the single JFET at all current levels. At 320 V the switch cell achieves up to 4.3× reduction in switching loss compared to the single JFET.

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A nonlinear resonant switch cell, comprising:
   a switch cell drain connection;
   a switch cell source connection;
   a first junction gate field-effect transistor with a first JFET drain, a first JFET source, and a first JFET gate, the first JFET drain electrically connected to the switch cell drain connection;
   a second junction gate field-effect transistor with a second JFET drain, a second JFET source, and a second JFET gate, the second JFET source electrically connected to the switch cell source connection;
   a third junction gate field-effect transistor with a third JFET drain, a third JFET source, and a third JFET gate, the third JFET drain electrically connected to the first JFET source, and the third JFET source electrically connected to the switch cell source connection;
   a resonant inductor with a first inductor terminal and a second inductor terminal, the first inductor terminal electrically connected to the first JFET source, and the second inductor terminal electrically connected to the second JFET drain;
   a recovery capacitor with a first capacitor terminal and a second capacitor terminal, the first capacitor terminal electrically connected to the switch cell drain connection;
   a drain clamp diode with a clamp anode and a clamp cathode, the clamp anode electrically connected to the second inductor terminal, and the clamp cathode electrically connected to the second capacitor terminal;
   an energy transfer diode with a transfer anode and a transfer cathode, the transfer anode electrically connected to the second capacitor terminal; and
   an energy recovery component with a first terminal and a second terminal, the first terminal electrically connected to the transfer cathode and the second terminal electrically connected to the switch cell source connection.

2. The nonlinear resonant switch cell of claim 1, further comprising:
   at least one main junction gate field-effect transistor with each main junction gate field-effect transistor including a main drain, a first main source, and a main gate, the main drain electrically connected to the switch cell drain connection, and the main source electrically connected to the switch cell source connection.

3. The nonlinear resonant switch cell of claim 2, wherein the nonlinear resonant switch cell is configured to operate in at least nine modes.

4. The nonlinear resonant switch cell of claim 3, wherein the nonlinear resonant switch cell is configured such that one of the modes comprises an off state wherein the first junction gate field-effect transistor and the at least one main junction gate field-effect transistor are off, and the second junction gate field-effect transistor and the third junction gate field-effect transistor are on to reduce ringing at the switch cell drain connection.

5. The nonlinear resonant switch cell of claim 3, wherein the nonlinear resonant switch cell is configured such that one of the modes comprises initiating a turn-on mode, wherein the third junction gate field-effect transistor is turned off.

6. The nonlinear resonant switch cell of claim 3, wherein the nonlinear resonant switch cell is configured such that one of the modes comprises a mode configured to turn on the first junction gate field-effect transistor with near zero current switching.

7. The nonlinear resonant switch cell of claim 6, further comprising a gate driver configured to determine an optimal timing of one of the nine modes.

8. The nonlinear resonant switch cell of claim 7, wherein the gate driver includes two volt-second detectors.

9. The nonlinear resonant switch cell of claim 3, wherein the nonlinear resonant switch cell is configured such that one of the modes comprises a mode configured to reverse a bias of the drain clamp diode and to decrease a voltage at the switch cell drain connection.

10. The nonlinear resonant switch cell of claim 3, wherein the nonlinear resonant switch cell is configured such that one of the modes comprises a mode configured to decrease a voltage at the switch cell drain connection and to turn on the at least one main junction gate field-effect transistor with true zero voltage switching.

11. The nonlinear resonant switch cell of claim 3, wherein the nonlinear resonant switch cell is configured such that one of the modes comprises a mode configured to turn off the second junction gate field-effect transistor under pseudo zero voltage switching.

12. The nonlinear resonant switch cell of claim 3, wherein the nonlinear resonant switch cell is configured such that one of the modes comprises a mode configured to retain a voltage on the second junction gate field-effect transistor by a capacitance of the second junction gate field-effect transistor, and to apply the voltage across the resonant inductor.

13. The nonlinear resonant switch cell of claim 3, wherein the nonlinear resonant switch cell is configured such that one of the modes comprises a mode configured to turn on the second junction gate field-effect transistor with true zero voltage switching.

14. The nonlinear resonant switch cell of claim 3, wherein the nonlinear resonant switch cell is configured such that one of the modes comprises a mode configured to turn off the first junction gate field-effect transistor and the at least one main junction gate field-effect transistor with pseudo zero voltage switching.

15. The nonlinear resonant switch cell of claim 1, further comprising at least one diode configured to prevent voltage spikes on at least one of the following: the first JFET gate, the second JFET gate, and the third JFET gate.

16. A nonlinear resonant switch cell comprising:
    a series connected top transistor and bottom transistor;
    a third transistor;
    a drain clamp diode with a clamp anode and a clamp cathode;

a switch cell drain connection;
a switch cell source connection;
a recovery capacitor with a first recovery capacitor terminal and a second recovery capacitor terminal, the second recovery capacitor terminal electrically connected to the switch cell drain connection; and
a saturable inductor with a first end and a second end, the first end connected at a connection point between the series connected top transistor and bottom transistor and the second end connected to the third transistor such that the saturable inductor is configured to be saturated to provide a substantially zero current switching event for the top transistor,
wherein the second end is connected to the drain clamp diode anode; and
wherein the drain clamp diode cathode is electrically connected to the first recovery capacitor terminal.

17. The nonlinear resonant switch cell of claim 16, wherein the saturable inductor is configured to receive a pulsed current.

18. A nonlinear resonant switch cell comprising:
a series connected top transistor and bottom transistor;
a third transistor;
a drain clamp diode with a clamp anode and a clamp cathode;
a switch cell drain connection;
a switch cell source connection;
a recovery capacitor with a first recovery capacitor terminal and a second recovery capacitor terminal, the second recovery capacitor terminal electrically connected to the switch cell drain connection; and
a saturable inductor with a first end and a second end, the first end connected at a connection point between the series connected top transistor and bottom transistor and the second end connected to the third transistor such that the saturable inductor is configured to be saturated to provide a first substantially zero voltage switching event for the top transistor and a second substantially zero voltage switching event for the third transistor,
wherein the second end connected to a drain clamp diode with a clamp anode; and
wherein the clamp cathode is electrically connected to the first recovery capacitor terminal.

* * * * *